(12) United States Patent
Lai et al.

(10) Patent No.: US 11,552,148 B2
(45) Date of Patent: Jan. 10, 2023

(54) ARRAY SUBSTRATE, MANUFACTURING METHOD THEREOF, AND DISPLAY APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Weilin Lai, Beijing (CN); Yucheng Chan, Beijing (CN); Jianbang Huang, Beijing (CN)

(73) Assignees: ORDOS YUANSHENG OPTOELECTRONICS CO., LTD., Ordos-Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 16/812,619

(22) Filed: Mar. 9, 2020

(65) Prior Publication Data
US 2020/0212153 A1 Jul. 2, 2020

Related U.S. Application Data

(63) Continuation of application No. 15/521,612, filed as application No. PCT/CN2016/101999 on Oct. 13, 2016, now Pat. No. 10,622,427.

(30) Foreign Application Priority Data

Oct. 15, 2015 (CN) .......................... 201510665742.0

(51) Int. Cl.
*H01L 21/02* (2006.01)
*H01L 27/32* (2006.01)
(Continued)

(52) U.S. Cl.
CPC ...... *H01L 27/3262* (2013.01); *H01L 21/0217* (2013.01); *H01L 21/02164* (2013.01);
(Continued)

(58) Field of Classification Search
CPC ....... H01L 21/02; H01L 21/266; H01L 27/12; H01L 27/32; H01L 29/66;
(Continued)

(56) References Cited

U.S. PATENT DOCUMENTS 5,592,318 A 1/1997 Majima et al.
5,830,787 A 11/1998 Kim
(Continued)

FOREIGN PATENT DOCUMENTS

CN 1530878 A 9/2004
CN 101833186 A 9/2010
(Continued)

OTHER PUBLICATIONS

Japanese Office Action in Japanese Application No. 2017-521204, dated Jan. 20, 2021 with English translation.
(Continued)

*Primary Examiner* — Fazli Erdem
(74) *Attorney, Agent, or Firm* — Collard & Roe, P.C.

(57) ABSTRACT

An array substrate, its manufacturing method, and a display apparatus are provided. The array substrate having a substrate, includes: a monocrystalline silicon substrate employed as the substrate including a central display area, a first peripheral area, and a second peripheral area; substrate circuits integrated with a scan drive circuit in the first peripheral area, a data drive circuit in the second peripheral area, and a plurality of pixel circuits in the central display area; a plurality of scan lines in the central display area and coupled to the scan drive circuit; and a plurality of data lines in the central display area and coupled to the data drive (Continued)

circuit. The scan drive circuit, the data drive circuit, and the plurality of pixel circuits include a plurality of transistors, each of which has an active region inside the monocrystalline silicon layer.

16 Claims, 15 Drawing Sheets

(51) Int. Cl.
| | |
|---|---|
| H01L 29/66 | (2006.01) |
| H01L 51/56 | (2006.01) |
| H01L 29/786 | (2006.01) |
| H01L 21/84 | (2006.01) |
| H01L 27/12 | (2006.01) |
| H01L 21/8234 | (2006.01) |
| H01L 21/265 | (2006.01) |
| H01L 21/266 | (2006.01) |
| H01L 21/768 | (2006.01) |
| H01L 51/52 | (2006.01) |

(52) U.S. Cl.
CPC ...... *H01L 21/266* (2013.01); *H01L 21/26513* (2013.01); *H01L 21/76802* (2013.01); *H01L 21/76877* (2013.01); *H01L 21/8234* (2013.01); *H01L 21/84* (2013.01); *H01L 27/12* (2013.01); *H01L 27/3246* (2013.01); *H01L 27/3248* (2013.01); *H01L 27/3258* (2013.01); *H01L 27/3276* (2013.01); *H01L 29/66772* (2013.01); *H01L 29/78654* (2013.01); *H01L 51/5218* (2013.01); *H01L 51/5234* (2013.01); *H01L 51/56* (2013.01); *H01L 27/124* (2013.01); *H01L 27/1222* (2013.01); *H01L 27/1248* (2013.01); *H01L 27/1262* (2013.01); *H01L 2251/5315* (2013.01)

(58) Field of Classification Search
CPC .............. H01L 29/66772; H01L 29/78; H01L 29/78654; H01L 51/52; H01L 51/56
USPC .......................................................... 257/40
See application file for complete search history.

(56) References Cited

U.S. PATENT DOCUMENTS

| | | | |
|---|---|---|---|
| 7,336,270 | B2 | 2/2008 | Sato |
| 7,723,725 | B2 | 5/2010 | Yamazaki et al. |
| 8,017,945 | B2* | 9/2011 | Yamazaki ........... H01L 27/3244 257/59 |
| 8,513,678 | B2 | 8/2013 | Yamazaki |
| 8,772,766 | B2* | 7/2014 | Yamazaki ........... H01L 27/3244 257/40 |
| 9,023,678 | B2 | 5/2015 | Heo et al. |
| 9,401,112 | B2 | 7/2016 | Ohara et al. |
| 9,431,574 | B2 | 8/2016 | Yamazaki |
| 9,721,509 | B2 | 8/2017 | Kim et al. |
| 9,875,690 | B2 | 1/2018 | Wang et al. |
| 10,147,747 | B2 | 12/2018 | Toriumi et al. |
| 10,796,641 | B2 | 10/2020 | Yang et al. |
| 11,037,529 | B2 | 6/2021 | Wang |
| 11,322,082 | B2 | 5/2022 | Hu et al. |
| 2002/0084463 | A1 | 7/2002 | Sanford et al. |
| 2003/0025659 | A1 | 2/2003 | Kondo et al. |
| 2005/0056832 | A1 | 3/2005 | Yamazaki et al. |
| 2005/0245046 | A1* | 11/2005 | Takafuji ........... H01L 27/1266 438/450 |
| 2006/0170634 | A1 | 8/2006 | Kwak et al. |
| 2007/0295961 | A1 | 12/2007 | Kim |
| 2008/0142807 | A1 | 6/2008 | Choe et al. |
| 2008/0169757 | A1 | 7/2008 | Chang et al. |
| 2008/0191603 | A1 | 8/2008 | Kubota |
| 2008/0210928 | A1* | 9/2008 | Abe ..................... H01L 27/285 257/306 |
| 2010/0025664 | A1 | 2/2010 | Park |
| 2011/0233553 | A1 | 9/2011 | Sakakura et al. |
| 2012/0007848 | A1 | 1/2012 | Han et al. |
| 2012/0105421 | A1 | 5/2012 | Tsai et al. |
| 2012/0235973 | A1 | 9/2012 | Yoo |
| 2013/0001601 | A1 | 1/2013 | Lee et al. |
| 2013/0328753 | A1 | 12/2013 | Tsuge |
| 2014/0159021 | A1 | 6/2014 | Song et al. |
| 2014/0299867 | A1 | 10/2014 | Ono et al. |
| 2014/0361276 | A1 | 12/2014 | Hsu et al. |
| 2014/0367652 | A1 | 12/2014 | Cho et al. |
| 2015/0108470 | A1 | 4/2015 | Yamazaki et al. |
| 2015/0108475 | A1 | 4/2015 | Ando et al. |
| 2015/0115224 | A1 | 4/2015 | Kou |
| 2015/0270326 | A1 | 9/2015 | Hekmatshoartabari et al. |
| 2016/0172431 | A1 | 6/2016 | Huang et al. |
| 2016/0181350 | A1 | 6/2016 | Lee |
| 2016/0275870 | A1 | 9/2016 | Kimura et al. |
| 2016/0293105 | A1 | 10/2016 | Wang et al. |
| 2016/0372711 | A1 | 12/2016 | Song et al. |
| 2017/0047004 | A1 | 2/2017 | Yoon et al. |
| 2017/0092707 | A1 | 3/2017 | Wang |
| 2017/0193879 | A1 | 7/2017 | Wang |
| 2017/0236885 | A1 | 8/2017 | Koshihara et al. |
| 2017/0301293 | A1 | 10/2017 | Zhu et al. |
| 2018/0102092 | A1 | 4/2018 | Kubota et al. |
| 2018/0151827 | A1 | 5/2018 | Kang et al. |
| 2018/0212011 | A1 | 7/2018 | Lai et al. |
| 2019/0251905 | A1 | 8/2019 | Yang et al. |
| 2019/0386074 | A1 | 12/2019 | Li et al. |
| 2020/0082757 | A1 | 3/2020 | Yuan et al. |
| 2021/0233968 | A1 | 7/2021 | Yang et al. |

FOREIGN PATENT DOCUMENTS

| | | |
|---|---|---|
| CN | 101980330 A | 2/2011 |
| CN | 102760841 A | 10/2012 |
| CN | 102983155 A | 3/2013 |
| CN | 103022079 A | 4/2013 |
| CN | 203026507 U | 6/2013 |
| CN | 103403787 A | 11/2013 |
| CN | 103440840 A | 12/2013 |
| CN | 103515413 A | 1/2014 |
| CN | 104025707 A | 9/2014 |
| CN | 104201190 A | 12/2014 |
| CN | 104240633 A | 12/2014 |
| CN | 104299572 A | 1/2015 |
| CN | 104332561 A | 2/2015 |
| CN | 104380368 A | 2/2015 |
| CN | 104681624 A | 6/2015 |
| CN | 105185816 A | 12/2015 |
| CN | 105225633 A | 1/2016 |
| CN | 204966501 U | 1/2016 |
| CN | 105304679 A | 2/2016 |
| CN | 106159100 A | 11/2016 |
| CN | 205789046 U | 12/2016 |
| CN | 107086237 A | 8/2017 |
| CN | 107103878 A | 8/2017 |
| CN | 107424570 A | 12/2017 |
| CN | 107591125 A | 1/2018 |
| CN | 107768385 A | 3/2018 |
| CN | 107799577 A | 3/2018 |
| CN | 109036279 A | 12/2018 |
| CN | 109119027 A | 1/2019 |
| CN | 109215549 A | 1/2019 |
| CN | 109509430 A | 3/2019 |
| CN | 109904347 A | 6/2019 |
| CN | 110071229 A | 7/2019 |
| EP | 1 096 571 A2 | 5/2001 |
| JP | H06-347828 A | 12/1994 |
| JP | 2001-195016 A | 7/2001 |
| JP | 2001-332383 A | 11/2001 |
| JP | 2007-156058 A | 6/2007 |
| JP | 2008-153191 A | 7/2008 |
| JP | 2009-003435 A | 1/2009 |
| JP | 2009-016410 A | 1/2009 |
| JP | 2011-181938 A | 9/2011 |

(56) References Cited

FOREIGN PATENT DOCUMENTS

| KR | 10-2008-0101732 A | 11/2008 |
|---|---|---|
| KR | 10-1645404 B1 | 8/2016 |
| KR | 10-2017-0005252 A | 1/2017 |

OTHER PUBLICATIONS

Japanese Office Action in Japanese Application No. 2017-521204, dated Jun. 8, 2020 with English translation.
International Search Report of PCT/CN2019/102314 in Chinese, dated May 27, 2020, with English translation.
Notice of Transmittal of the International Search Report of PCT/CN2019/102314 in Chinese, dated May 27, 2020.
Written Opinion of the International Searching Authority of PCT/CN2019/102314 in Chinese, dated May 27, 2020 with English translation.
International Search Report of PCT/CN2019/102293 in Chinese, dated Apr. 26, 2020, with English translation.
Notice of Transmittal of the International Search Report of PCT/CN2019/102293 in Chinese, dated Apr. 26, 2020.
Written Opinion of the International Searching Authority of PCT/CN2019/102293 in Chinese, dated Apr. 26, 2020 with English translation.
International Search Report of PCT/CN2019/102307 in Chinese, dated May 26, 2020, with English translation.
Notice of Transmittal of the International Search Report of PCT/CN2019/102307 in Chinese, dated May 26, 2020.
Written Opinion of the International Searching Authority of PCT/CN2019/102307 in Chinese, dated May 26, 2020 with English translation.
International Search Report of PCT/CN2019/102819 in Chinese, dated May 26, 2020, with English translation.
Notice of Transmittal of the International Search Report of PCT/CN2019/102819 in Chinese, dated May 26, 2020.
Written Opinion of the International Searching Authority of PCT/CN2019/102819 in Chinese, dated May 26, 2020 with English translation.
English translation of International Search Report of PCT/CN2016/101999, dated Jan. 18, 2017.
English translation of Notice of Transmittal of the International Search Report of PCT/CN2016/101999, dated Jan. 18, 2017.
English translation of Written Opinion of the International Searching Authority of PCT/CN2016/101999, dated Jan. 18, 2017.
Korean Office Action in Korean Application No. 10-2017-7009789, dated Aug. 20, 2018 with English translation.
English translation of Extended European Search Report in EP Application No. 16852868.5 dated May 9, 2019.
Korean Notice of Allowance in Korean Application No. 10-2019-7009729, dated May 8, 2019 with English translation.
Chinese Office Action in Chinese Application No. 201980001517.3 dated Sep. 1, 2021 with English translation.
U.S. Office Action in U.S. Appl. No. 16/916,671 dated Oct. 1, 2021.
Office Action in U.S. Appl. No. 16/959,398 dated Nov. 26, 2021.
U.S. Final Office Action in U.S. Appl. No. 16/916,671 dated Feb. 24, 2022.
U.S. Office Action in U.S. Appl. No. 16/814,119 dated Apr. 20, 2022.
Indian Office Action in Indian Application No. 202017056357 dated Mar. 29, 2022 with English translation.
Indian Office Action in Indian Application No. 202017056072 dated Apr. 7, 2022 with English translation.
U.S. Non-Final Office Action in U.S. Appl. No. 16/959,757 dated May 27, 2022.
Chinese Office Action in Chinese Application No. 201980001452.2 dated May 11, 2022 with English translation.
Extended European Search Report in European Application No. 19931503.7 dated May 30, 2022.
Extended European Search Report in European Application No. 19933233.9 dated Jul. 13, 2022.
Extended European Search Report in European Application No. 19932239.7 dated Aug. 1, 2022.
Extended European Search Report in European Application No. 19933232.1 dated Sep. 6, 2022.

\* cited by examiner

ARRAY SUBSTRATE, MANUFACTURING METHOD THEREOF, AND DISPLAY APPARATUS

CROSS-REFERENCES TO RELATED APPLICATION

This application is a continuation of U.S. application Ser. No. 15/521,612 filed Apr. 24, 2017, and Applicant claims priority under 35 U.S.C. § 120 of U.S. application Ser. No. 15/521,612 filed Apr. 24, 2017 which application is a national stage application under 35 U.S.C. § 371 of PCT Application No. PCT/CN2016/101999 filed Oct. 13, 2016 which claims priority under 35 U.S.C. § 119 from Chinese Patent Application No. 201510665742.0 filed on Oct. 15, 2015, the disclosures of all of these applications are hereby incorporated by reference in their entirety. A certified copy of priority Chinese Patent Application No. 201510665742.0 is contained in parent U.S. application Ser. No. 15/521,612.

TECHNICAL FIELD

The disclosure relates generally to the field of display technologies, and more specifically to an array substrate, its manufacturing method, and a display apparatus.

BACKGROUND

With an increasingly high need among customers for audio and video electronics products, the development of high-resolution and high-quality display devices has become a trend among manufacturers.

Due to its advantages such as self-illumination, high brightness, wide viewing angle, fast response time, and allowance to manufacture R, G and B full-color components, AMOLED has been regarded as one important next-generation display panel technology. In current markets, there have been audio panels and mobile phones employing small and medium size AMOLED as display panels, and it is expected that application of AMOLED can be expanded to other fields, especially the large-area display panels including mobile products, notebook computers, monitors, wall-hanging TV, etc.

The AMOLED technologies have transitioned from amorphous silicon thin film transistor (TFT) glass substrates to polycrystalline silicon thin film transistor glass substrates, and especially to low-temperature polycrystalline silicon thin film transistor glass substrates, currently the mainstream technology. The "low temperature" refers to a fabrication process temperature of below 600° C. During this process, excimer lasers are employed as a heat source; after passing through the projection system, laser beams with uniform energy distribution are produced, which project on the glass substrate with an amorphous-silicon structure. Atoms of the amorphous silicon thin film are rearranged upon absorption of the laser energy, so as to form a polysilicon structure with reduced defects, which has a high electron mobility of 50-300 cm2/v-sec.

As such, the thin film transistor components can be manufactured to be smaller, resulting in increased aperture ratio, improved light transmittance of the panel, and reduced power consumption. Therefor compared with the amorphous silicon technology, a low-temperature polycrystalline silicon thin film transistor display has a carrier mobility rate of more than a hundred times, has a lower power consumption, a higher brightness, and a higher resolution, and is also lighter, thinner, smaller, of higher quality, and easier to implement integration of the driving circuit module.

As for the integration of the driving circuit module as mentioned above, a scan (gate) drive circuit, or a scan (gate) driver, is integrated at a glass substrate along with a TFT array, through a process called GOA (Gate driver On Array) or GOP (Gate driver On Panel).

The GOA technology integrates scan drive circuit into an array substrate, to thereby remove the need for a dedicated scan drive integrated circuit. As such, GOA technology can potentially save materials, simplify manufacturing processes, and reduce manufacturing cost.

SUMMARY

At least one embodiment of the disclosure provides an array substrate having a substrate, comprising: a monocrystalline silicon substrate employed as the substrate comprising a central display area, a first peripheral area, and a second peripheral area; substrate circuits integrated with a scan drive circuit in the first peripheral area, a data drive circuit in the second peripheral area, and a plurality of pixel circuits in the central display area; a plurality of scan lines in the central display area and coupled to the scan drive circuit; and a plurality of data lines in the central display area and coupled to the data drive circuit; wherein: a plurality of pixel regions are defined by intersections of the plurality of scan lines and the plurality of data lines; pixel circuit in each of the pixel regions is coupled to one of the scan lines and one of the data lines; the scan drive circuit, the data drive circuit, and the plurality of pixel circuits comprise a plurality of transistors, each of which has an active region inside the monocrystalline silicon layer; and carrier mobility of the monocrystalline silicon substrate is greater than 600 $cm^2$/V-sec.

In some examples, the transistors in the data drive circuit and in the scan drive circuit are smaller than a transistor having an active layer of amorphous silicon or polysilicon while ensuring the same performance as the transistor having the active layer of amorphous silicon or polysilicon.

In some examples, sizes of transistors in the data drive circuit and in the scan drive circuit are configured to be reduced while still ensuring performance to reduce area occupied by the data drive circuit and the scan drive circuit and to increase the central display area; and the central display area is expanded towards both sides along the direction from the central display area to the first peripheral area so as to benefit narrowing of border regions where the first peripheral area is located.

In some examples, the active region is an ion-doped part of the monocrystalline silicon substrate.

In some examples, the substrate circuits further comprise: a first insulating layer, disposed over the monocrystalline silicon substrate; a gate layer, disposed over the first insulating layer and comprising a gate electrode pattern of the plurality of transistors; a second insulating layer, disposed over and covering the gate layer and the first insulating layer; a source/drain layer, disposed over the second insulating layer and comprising a drain electrode pattern and a source electrode pattern of the plurality of thin film transistors; and a plurality of first vias, arranged to run through the first insulating layer and the second insulating layer, and configured to couple the drain electrode pattern or the source electrode pattern of the plurality of transistors to the active region inside the monocrystalline silicon layer.

In some examples, the array substrate further comprises an anode conductive layer, wherein the anode conductive layer is arranged in each of the plurality of pixel regions, disposed over the source/drain layer of the substrate circuits, and configured to output a drive current of an organic light-emitting layer in each of the plurality of pixel regions.

In some examples, the substrate circuits further comprises a planarization layer, wherein: the planarization layer is disposed over and covering the source/drain layer and the second insulating layer and below the anode conductive layer; and within each of the plurality of pixel regions, the planarization layer is arranged with a second via, configured to couple the source electrode pattern or the drain electrode pattern of the plurality of transistors in the second metal layer to the anode conductive layer.

In some examples, a reflective surface is arranged on a surface of the anode conductive layer opposite to the substrate, and is configured to reflect light emitted from the organic light-emitting layer.

In some examples, the active region is a part of the monocrystalline silicon layer at a side facing the circuit layer, and the active region has a thickness less than that of the monocrystalline silicon layer.

In some examples, the active region has a dopant concentration smaller than that of a part of the monocrystalline silicon layer other than the active region.

In some examples, the circuit layer comprises a gate layer and a source/drain layer stacked on the substrate and insulated from each other, the gate layer includes the gate lines and gate electrodes of the plurality of transistors, and the source/drain layer includes the data lines and the source and drain electrodes of the plurality of transistors.

At least one embodiment of the disclosure provides a display apparatus, comprising an array substrate as mentioned above.

In some examples, the display apparatus further comprises an organic light-emitting layer, disposed over the array substrate in a region for each of the plurality of pixels and configured to emit light upon application of a drive current.

In some examples, the display apparatus further comprises a transparent cathode conductive layer, disposed over the organic light-emitting layer in the region for each of the plurality of pixels.

In some examples, the display apparatus further comprises a pixel defining layer, disposed over the array substrate, wherein: the pixel defining layer is provided with an opening for disposing the organic light-emitting layer and the transparent cathode conductive layer in each of the plurality of pixels.

At least one embodiment of the disclosure provides a method for manufacturing an array substrate as mentioned above, comprising: forming an active region for each of the plurality of transistors in the monocrystalline silicon substrate; and forming a circuit layer including the gate layer and the source/drain layer over the monocrystalline silicon substrate.

In some examples, forming the active region for each of the plurality of transistors in the monocrystalline silicon layer comprises: forming a mask pattern over the monocrystalline silicon substrate, the mask pattern covering areas outside the active region for each of the plurality of transistors; and performing ion implantation to the monocrystalline silicon substrate under cover of the mask pattern, so as to form the active region for each of the plurality of transistors inside the monocrystalline silicon layer.

In some examples, forming the circuit layer over the monocrystalline silicon layer comprises: forming a first insulating layer over the monocrystalline silicon substrate; forming the gate layer over the first insulating layer, wherein the gate layer comprises a gate electrode pattern of the plurality of transistors; forming a second insulating layer over the gate layer and the first insulating layer, the second insulating layer covering the gate layer and the first insulating layer; forming a plurality of first vias, such that the plurality of first vias each runs through the first insulating layer and the second insulating layer; and forming the source/drain layer in the plurality of first vias and over the second insulating layer, the source/drain layer comprising a source electrode pattern and a drain electrode pattern of the plurality of transistors, and the source electrode pattern and the drain electrode pattern of the plurality of transistors being coupled to the active region in the monocrystalline layer via the plurality of first vias.

In some examples, forming the circuit layer over the monocrystalline silicon substrate further comprises: forming a planarization layer over the source/drain layer and the second insulating layer, wherein the planarization layer covers the source/drain layer and the second insulating layer.

In some examples, the method further comprises, after forming the circuit layer over the monocrystalline silicon substrate: forming an anode conductive layer over the circuit layer, wherein forming the circuit layer comprises: forming a plurality of second vias, wherein each of the plurality of second vias runs through the planarization layer within a region for each of the plurality of pixel regions; and forming the anode conductive layer in the plurality of second vias and over the planarization layer, and within each of the plurality of pixel regions; wherein at least one of the first insulating layer and the second insulating layer are formed by a double deposition process, comprising: forming a silicon oxide ($SiO_x$) layer; and forming a silicon nitride ($SiN_x$) layer over the silicon oxide ($SiO_x$) layer.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1A:
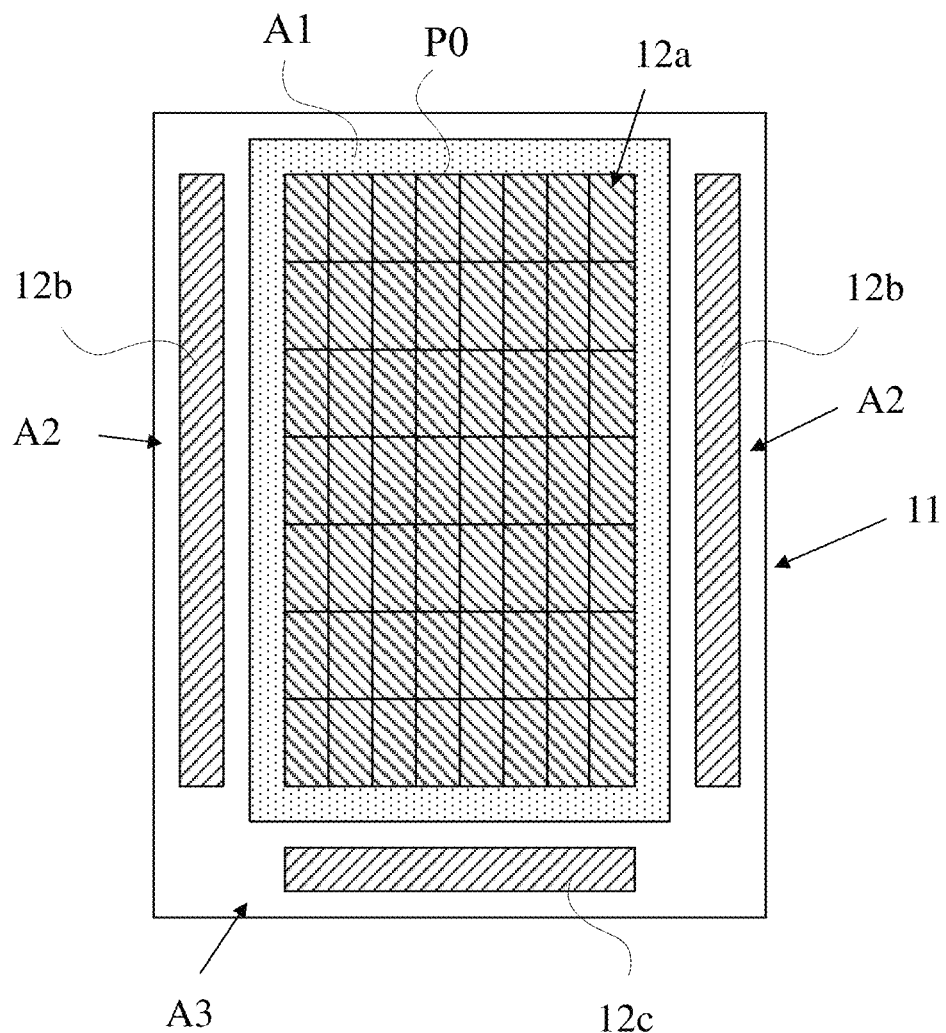
FIG. 1A is a plain view illustrating an array substrate according to some embodiments of the disclosure.

In the following, as shown in the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Current Gate Driver On Array (GOA, also called Gate Driver On Panel, GOP) technologies integrate the scan drive circuit into an array substrate by manufacturing the scan drive circuit in an array process, followed by mask patterning and yellow light fabrication process.

However, current GOA technologies do not normally integrate into the array substrate circuits other than the scan drive circuits, mainly because structures of the other circuits, such as a data drive circuit, are more complex than the structure of the scan drive circuit. The more complex circuits can occupy relatively large areas if manufactured over a glass substrate, and consequently will reduce the size of the display area. In addition, the data drive circuits should be able to process a large amount of display data accurately and quickly. As such, there are strict requirements for the performance of the components (especially the reaction speed). Therefore, the array substrate in existing technologies generally cannot satisfy the performance requirements of integrating other circuits with the array substrate.

If scan drive circuits and data drive circuits are to be simultaneously manufactured and integrated in an array substrate by current amorphous silicon or polycrystalline silicon GOA technologies, a relatively large area on the array substrate will need to be occupied. It is because the thin film transistors (TFTs) manufactured by the amorphous silicon or polycrystalline silicon technologies cannot achieve smaller sizes, and thus leading to a squeezed display area on the display panel. As such, only scan drive circuits can be integrated in an array substrate, whereas the data drive circuits are fabricated on an integrated circuit (IC), which is attached on a side of the array substrate, so as to leave a relatively large display area.

Figure 1B:
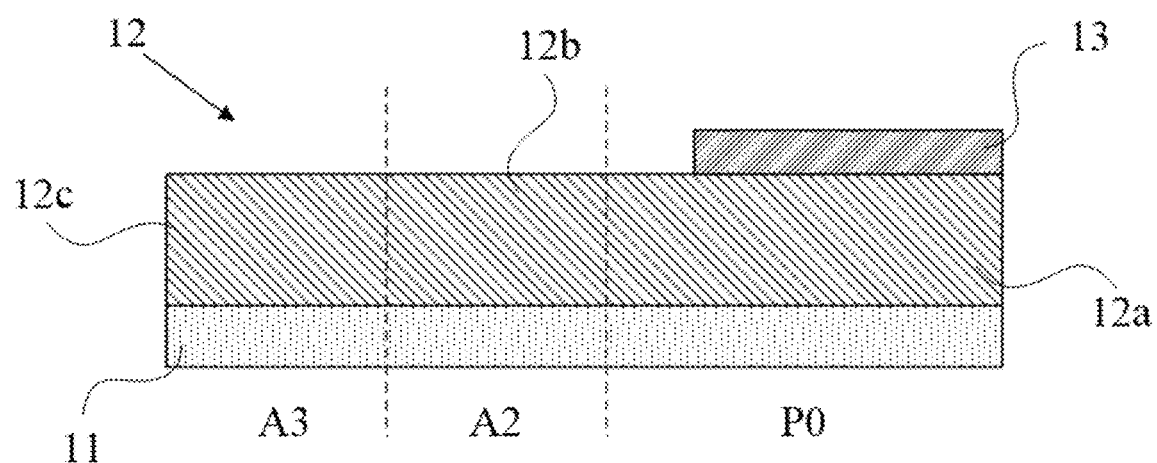
FIG. 1B is a cross-sectional view of an array substrate according to some embodiments of the disclosure.

FIG. 1A and FIG. 1B are structural diagrams of an array substrate according to some embodiments of the disclosure. As shown in FIG. 1A and FIG. 1B, the array substrate comprises a monocrystalline silicon substrate 11, an array circuit layer 12, and an anode conductive layer 13. A central display area A1, a first peripheral area A2, and a second peripheral area A3 are configured over the monocrystalline silicon substrate 11. The central display area A1 comprises a plurality of pixel regions P0. The configuration of the plurality of pixel regions P0 in the central display area A1 can be determined based on the needs of specific display applications.

An array circuit layer 12 is formed over the monocrystalline silicon substrate 11 and comprises a plurality of transistors formed in an active region at the monocrystalline silicon substrate 11. In the array circuit layer 12, a scan drive circuit 12b is formed within the first peripheral area A2, a data drive circuit 12c is formed within the second peripheral area A3, and a pixel circuit 12a is formed in each of the pixel regions P0. In addition, an anode conductive layer 13 is formed over the array circuit layer 12 in each of the pixel regions P0, and is configured to output the drive current of an organic light-emitting layer in each of the pixel regions P0, and to reflect the light from the organic light-emitting layer.

It can be appreciated that the scan drive circuit 12b, the data drive circuit 12c, and the pixel circuit 12a are coordinated with one another to output the drive current of the anode conductive layer 13, each comprising a portion of the above-described plurality of transistors to realize their respective circuit functionality. To achieve such functionality, the array circuit layer 12 can further comprise circuit connection lines and other electronic components that are necessary.

The array substrate disclosed herein can be employed to form an organic light-emitting diode (OLED) display, and thus the specific structure of the array substrate can be configured as part of an OLED display apparatus. For example, the digital circuit structure of the data drive circuit can be realized by employing logic gate circuits comprising transistors, and the shift register unit of the scan drive circuit can be realized by employing existing transistor circuits.

Compared with existing OLED display apparatuses, the array substrate according to some embodiments disclosed herein employs a monocrystalline silicon substrate as the substrate, and the active region including a plurality of transistors in the array circuit layer 12 that comprises the scan drive circuit 12b, the data drive circuit 12c, and the pixel circuit 12a is formed in the monocrystalline silicon substrate 11.

Because the carrier mobility of monocrystalline silicon can be >600 cm2/V-sec, the transistors in the data drive circuit and in the scan drive circuit can have sufficiently high performance, and their sizes can be reduced compared with existing technologies while ensuring the performance. As such, the data drive circuit and the scan drive circuit do not occupy a large area of the substrate, and instead, the area outside the display area can be reduced, thereby increasing the display area.

Figure 2:
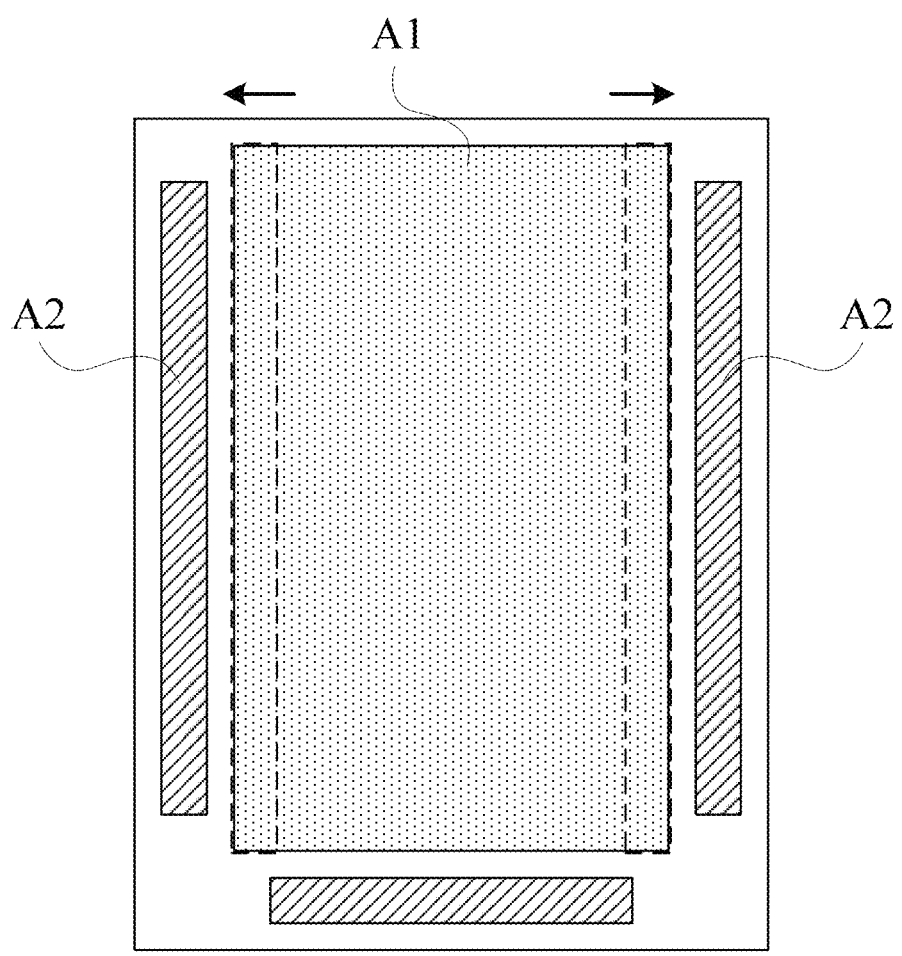
FIG. 2 is a schematic diagram illustrating the effect of increasing the display area according to some embodiments of the disclosure.

For example, FIG. 2 is a schematic view showing the effect of an increased display area according to some embodiments of the disclosure. As shown in FIG. 2, because the monocrystalline silicon substrate is employed and the active region of the transistors is formed in the monocrystalline silicon substrate, compared with existing technologies, the sizes of the transistors in the scan drive circuit can be reduced while still ensuring the performance.

As such, the area of the first peripheral area A2 configured to form the scan drive circuit therein can be reduced, and under the condition that the substrate area is not altered, the central display area A1 can be expanded towards both sides along the direction of the arrows, thereby increasing the area in the dotted box, and benefiting the narrowing of the border regions where the first peripheral area A2 is located.

Figure 3:
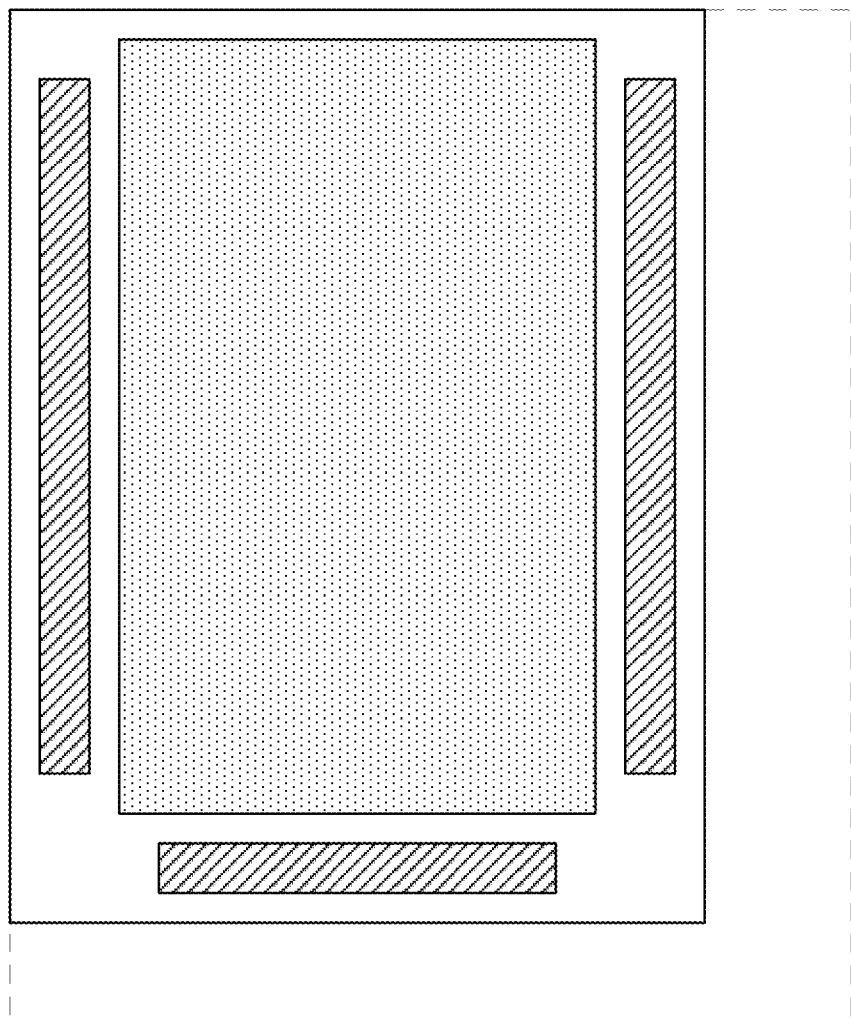
FIG. 3 is a schematic diagram illustrating the effect of reducing the size of the device according to some embodiments of the disclosure.

FIG. 3 is a schematic view illustrating the effect of reducing the size of the device according to some embodiments of the disclosure. As shown in FIG. 3, the sizes of all transistors in the pixel circuit and in the scan drive circuit can be reduced compared with existing technologies, therefore the area they occupy over the substrate can be reduced as a whole under the condition that the circuit performance is ensued and the number of pixels is not changed.

Furthermore, the data drive circuit formed over the monocrystalline silicon substrate does not occupy a large area over the substrate under the condition that the transistors have good performance. As such, the size of the display apparatus formed by the array substrate according to the embodiments of the disclosure can be smaller compared with a conventional display apparatus, whose size is shown by the dotted box in FIG. 3.

Because the transistors as disclosed herein are manufactured on a monocrystalline silicon substrate, compared with display apparatus manufactured by the a-Si process and the p-Si process, the sizes of the transistors in each of the pixel regions in the display apparatus manufactured by the process in this disclosure can be reduced while still ensuring the performance, therefore more pixel units can be configured in an area of the same size to achieve higher resolution.

Figure 4A:
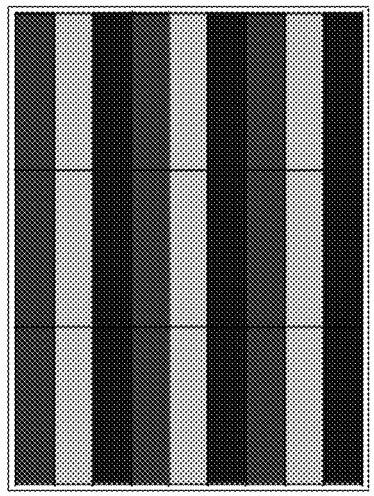
FIG. 4A illustrates a display resolution of a display apparatus manufactured with an amorphous-Si process.
Figure 4B:
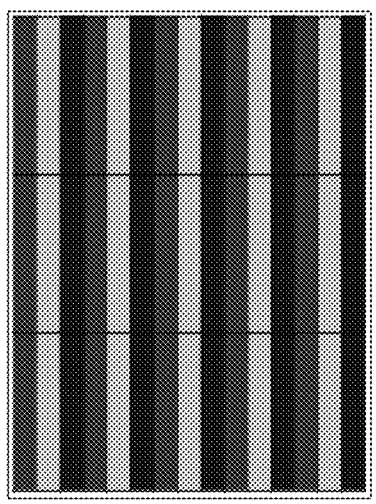
FIG. 4B illustrates a display resolution of a display apparatus manufactured with a poly-Si process.
Figure 4C:
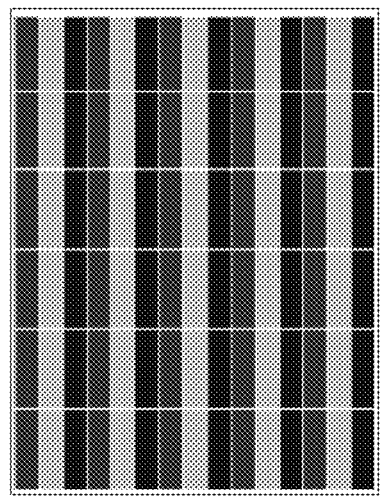
FIG. 4C illustrates a display resolution of a display apparatus manufactured with a process according to some embodiments of the disclosure, for a comparison with FIGS. 4A and 4B.

FIG. 4A, FIG. 4B and FIG. 4C are schematic diagrams comparing the resolutions of display apparatus fabricated by an amorphous silicon (a-Si) process (FIG. 4A), a polycrystalline silicon (p-Si) process (FIG. 4B), and the process according to one embodiment of the disclosure (c-Si, FIG. 4C).

Figure 5:
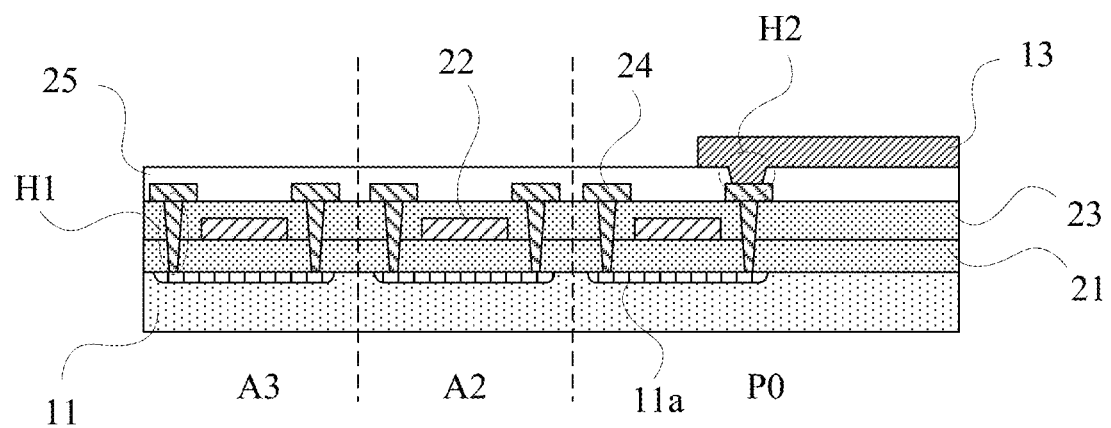
FIG. 5 is a cross-sectional view of the structure of an array substrate according to some embodiments of the disclosure.

FIG. 5 is a cross-sectional view of the structure of an array substrate according to some embodiments of the disclosure, which is an example illustrating the structure of the above-described array circuit layer 12. As shown in FIG. 5, the array circuit layer 12 specifically comprises: a first insulating layer 21, formed over the monocrystalline silicon substrate 11; a first metal layer 22, formed over the first insulating layer; a second insulating layer 23 that covers the first metal layer 22 and the first insulating layer 21; a second metal layer 24 formed over the second insulating layer 23; and a planarization layer 25 that covers the second metal layer 24 and the second insulating layer 23.

The first metal layer 22 comprises patterns for gate electrodes of a plurality of transistors. The second metal layer 24 comprises patterns for the source electrodes and drain electrodes of a plurality of transistors. An active region 11a is formed within the formation area of a plurality of transistors inside the monocrystalline silicon substrate 11.

A plurality of first vias H1 are formed through the first insulating layer 21 and the second insulating layer 23, so that the patterns of the source electrodes and the patterns of the drain electrodes of the plurality of transistors can come into contact with the active region 11a in the monocrystalline silicon substrate 11 through the plurality of first vias H1.

As such, the first insulating layer 21 and the second insulating layer 23 can function as the gate insulating layers of the above-described plurality of transistors which ensure that the gate electrodes and the active region are insulated from each other, and that the gate electrodes and the source electrodes or drain electrodes are insulated from each other.

As shown in FIG. 5, the source electrodes and the drain electrodes can contact with the active region 11a at different locations, so as to form a channel area that can generate source and drain current in the active region 11a, and to configure the gate electrodes at the corresponding locations of the channel area to realize the functionality of the transistors. The specific types of the above-described transistors need to be determined according to the compositions of the active region 11a, and they can be all P-type thin film transistors (TFTs) in order for the manufacturing process to be uniform to reduce the manufacturing costs and improve the stability of the performance of the transistors. It can be understood, after determining the transistors as N-type or P-type, ways to connect the source electrodes and the drain electrodes can be determined according to specific applications by those skilled in the art and are be repeated herein.

In addition, in each pixel region, second vias H2 are arranged in the planarization layer 25, and are employed to connect the patterns of the source electrodes or the drain electrodes of at least one transistor in the second metal layer 24 to the anode conductive layer 13. That is, there is at least one transistor in the pixel circuit 12a in a pixel region P0 that is connected to the anode conductive layer 13, and the source electrodes or the drain electrodes of the transistors can be connected to the anode conductive layer 13 through the second vias H2 inside the planarization layer 25, so as to realize the output of the drive current of the organic light-emitting layer.

It can be appreciated that the specific number of the above-described plurality of transistors can be determined according to the specific circuit structure of the selected scan drive circuit 12b, data drive circuit 12c and pixel circuit 12a.

Figure 6:
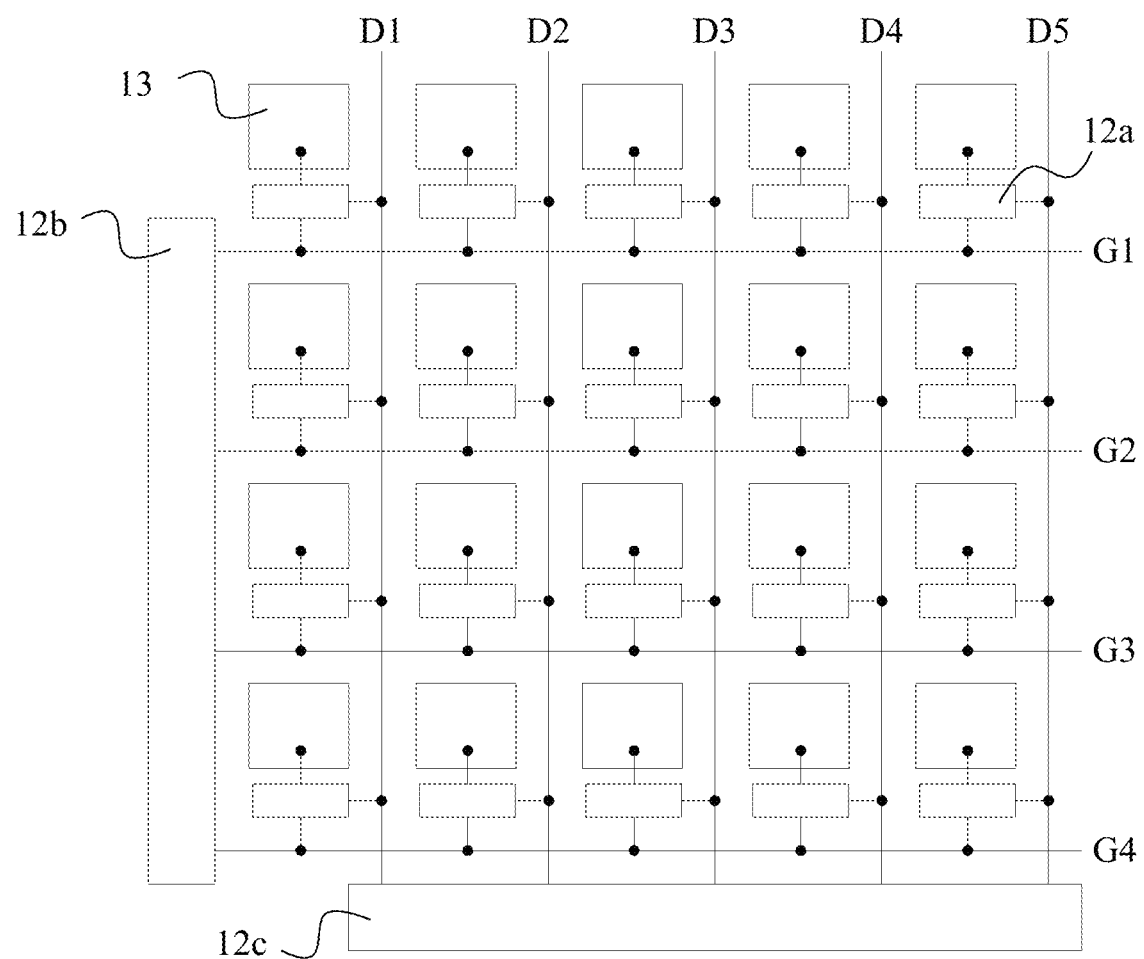
FIG. 6 is a schematic view of electrical connections of an array substrate according to some embodiments of the disclosure.

On the other hand, as an illustration of the circuit connection relationship in the array circuit layer 12, FIG. 6 is a schematic view of the circuit connection relationship of an array substrate according to one embodiment of the disclosure. As shown in FIG. 6, the above-described scan drive circuit 12b is connected to multiple rows of scan lines as shown by G1, G2, G3, G4; the above-described data drive circuit 12c is connected to multiple columns of data lines as shown by D1, D2, D3, D4, D5; and the above-described plurality of pixel regions P0 are defined by the intersection of rows of scan lines and columns of data lines formed in the central display area A1.

The pixel circuit 12a in each of the pixel regions P0 is coupled to one row of scan line and one column of data line respectively. The pixel circuit 12a is employed to generate the drive current flowing to the anode conductive layer 13 according to the data voltage from the data lines under the control of the signals of the scan lines. Thus, under the coordination of the scan drive circuit 12b, the data drive circuit 12c, and the pixel circuit 12a, the array circuit layer 12 can realize the output of the drive current of the anode conductive layer 13 in each of the pixel regions P0.

It can be appreciated that the number of the scan lines, the number of the data lines, the number of the pixel regions, the number of the signal output terminals of the scan drive circuit 12b, and the number of the output terminals of the data voltage of the data drive circuit 12c can be configured according to specific applications.

Figure 7:
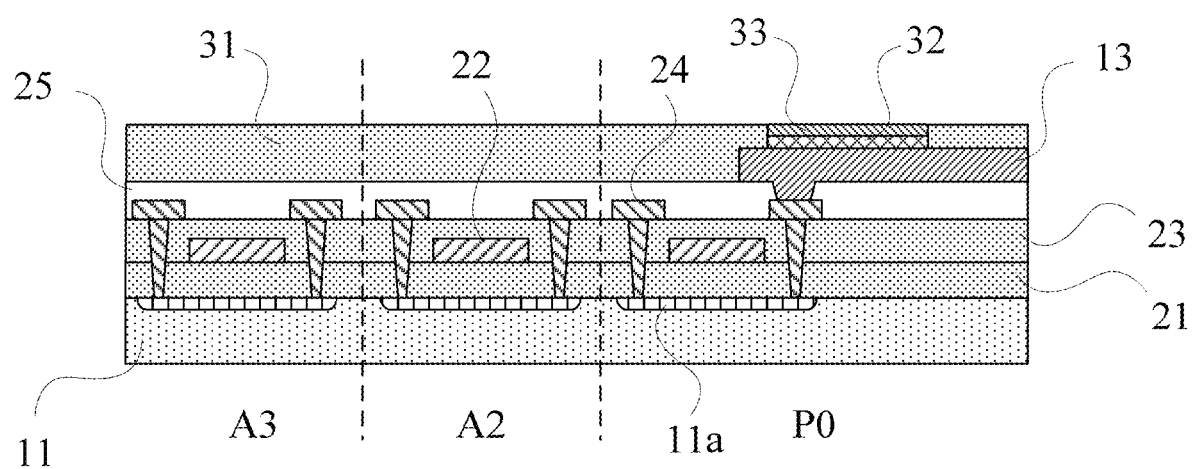
FIG. 7 is a cross-sectional view of a display apparatus according to some embodiments of the disclosure.

In addition, in the cross-sectional structure as shown in FIG. 5, the first metal layer 22 can comprise patterns of multiple rows of scan lines; and the second metal layer 24 can comprise patterns of multiple columns of data lines, so as to realize the circuit connection relationships via same-layer connections as shown in FIG. 7.

The second metal layer 24 can also comprise patterns of the above-described multiple rows of scan lines, and the first metal layer 22 may also comprise patterns of the above-described multiple columns of data lines, thus solving the issues of increased thickness of the patterns of the gate electrodes under certain situations, or the issues of overly large coupling capacitance between the metal layers under some other situations. In this embodiment, the circuit connection relationships as shown in FIG. 6 can be achieved by configuration of new connection vias in the second insulating layer 23.

In any of the above-described array substrates, it can be appreciated that the formation area of any one of the transistors in the plurality of transistors over the array substrate can be smaller than a first preset value. It should be noted that the first preset value represents the upper limit of all transistors, and can have different values according to different width-to-length ratios of the channel.

In specific implementations, the first preset value can be determined by measuring the actual parameters of the monocrystalline silicon substrate. It can be appreciated that, compared with a-Si and p-Si, the first preset value in embodiments of the disclosure has a smaller first preset value, thereby increasing the display area, reducing the size of the device, and improving the display resolution.

On the basis of any one of the above-described array substrates, the disclosure further provides a display apparatus comprising any one of the above-described array substrates. It should be noted that the display apparatus disclosed herein can be any products or components that has a display function, such as a display panel, an electronic paper, a cell phone, a tablet computer, a television, a notebook computer, a digital phone frame, and a navigation system.

It can be understood that the display apparatus disclosed herein can also achieve integrated manufacturing of the scan drive circuit and the data drive circuit over the substrate, and can further reduce the area outside the display area, increase the display area, and reduce the size of the device without affecting the functionality of the circuits and numbers of the pixels, which is beneficial to the improvement of the display resolution.

As a specific example, FIG. 7 is a cross-sectional view of a display apparatus according to some embodiments of the disclosure. As shown in FIG. 7, on the basis of the structure of the array substrate as shown in FIG. 5, the display apparatus further comprises a pixel defining layer 31 that covers the planarization layer 25 and the anode conductive layer 13. The pixel defining layer 31 is provided with an opening area, configured to expose the anode conductive layer 13 in the pixel region P0, and is also provided with an organic light-emitting layer 32, whose one side is in contact with the anode conductive layer 13 in the opening area, and whose another side is provided with a transparent cathode conductive layer 33 that is in contact with the organic light-emitting layer 32.

It should be appreciated that in each of the pixel regions P0, the anode conductive layer 13 can provide a drive current to the organic light-emitting layer 32, and the cathode conductive layer 33 can provide a corresponding bias electric potential, so as to enable the organic light-emitting layer 32 to emit light with corresponding luminance depending on the strength of the drive current. Since the anode conductive layer 13 can also reflect the light from the organic light-emitting layer 32, the majority of the light emitted from the organic light-emitting layer 32 can emit through the transparent cathode conductive layer 33 to form a top-emitting OLED (TEOLED) display.

The display apparatus of the embodiments of the disclosure can further comprise other structures that are not shown in the drawings, which include, for example, package structures that have functions of supporting, connecting and protection, and power supply circuits used for supplying power.

Figure 8:
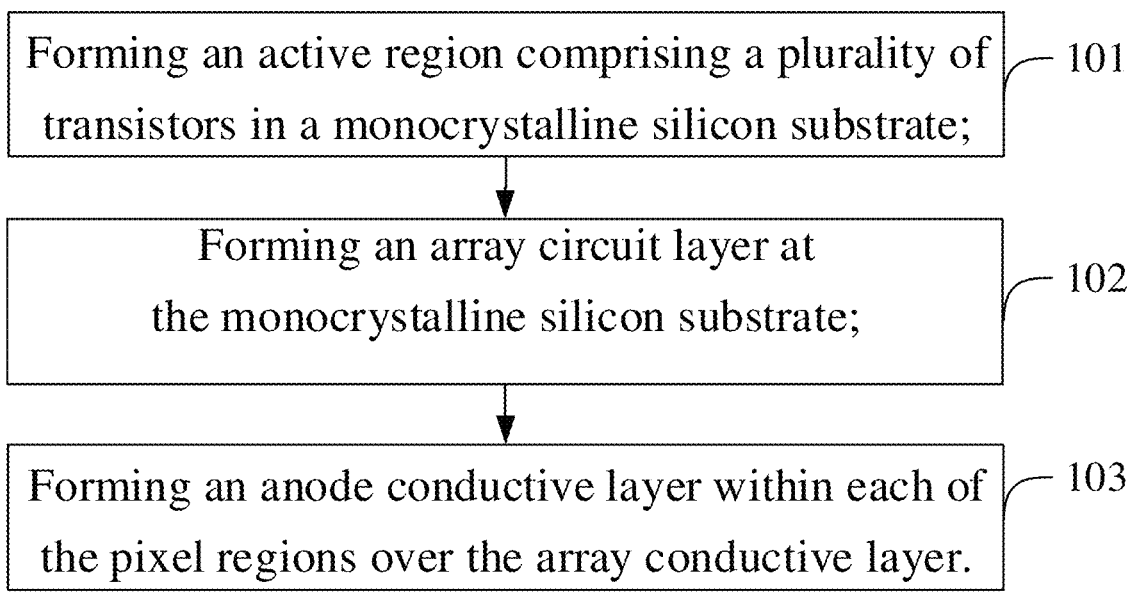
FIG. 8 is a flow chart illustrating the steps of a method for manufacturing an array substrate according to some embodiments of the disclosure.

For any one of the above-described array substrates, FIG. 8 is a flow chart illustrating the manufacturing method of an array substrate according to some embodiments of the disclosure. As shown in FIG. 8, the method comprises:

101: forming an active region comprising a plurality of transistors in a monocrystalline silicon substrate;

102: forming an array circuit layer over the monocrystalline silicon substrate;

103: forming an anode conductive layer within each of the pixel regions over the array conductive layer.

It can be appreciated that the manufacturing method disclosed herein can be employed for manufacturing any one of the above-described array substrates.

In some embodiment, Step 101 of forming an active region comprising a plurality of transistors in a monocrystalline silicon substrate comprises the following sub-steps (not shown in the figures):

101a: forming a mask pattern over the monocrystalline silicon substrate, wherein the mask pattern covers areas outside the active region comprising the plurality of transistors;

101b: conducting ion implantation to the monocrystalline silicon substrate under covering by the mask pattern, so as to form an active region comprising a plurality of transistors that is located in the monocrystalline silicon substrate;

101c: removing the mask pattern.

Figure 9:
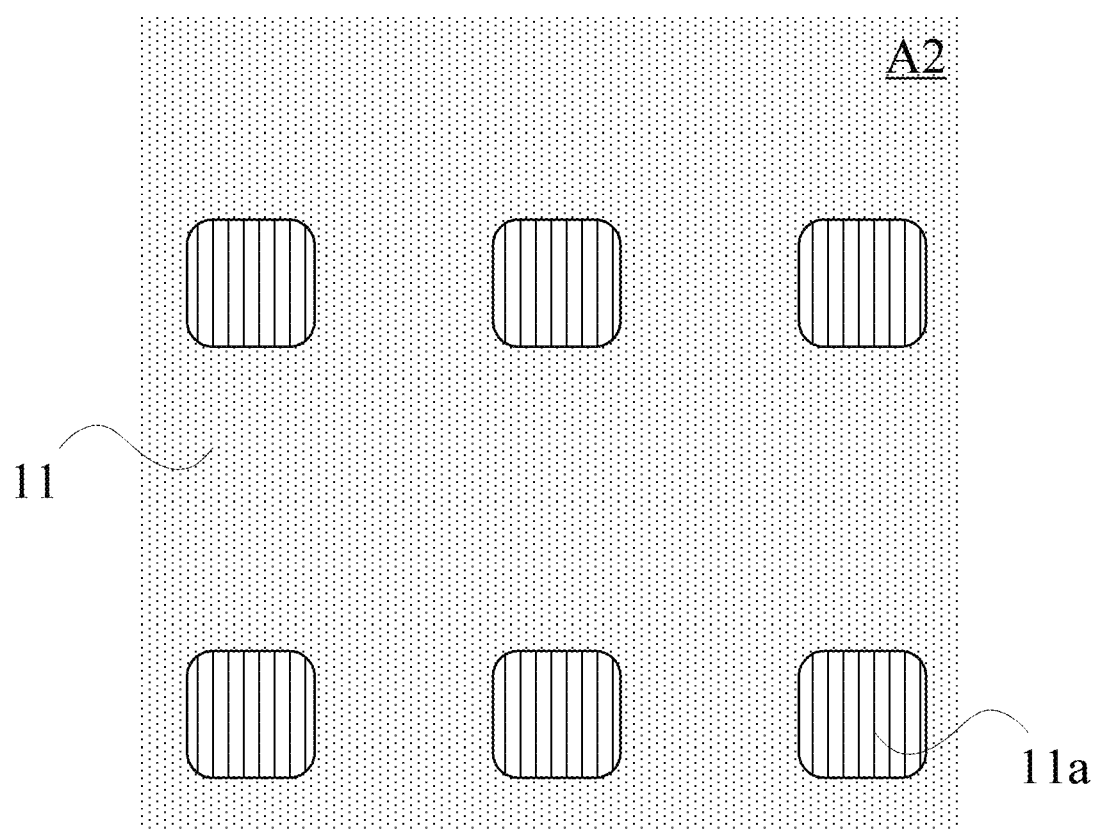
FIG. 9 is a schematic view of an active region in a first peripheral area according to some embodiments of the disclosure.

As a specific example, FIG. 9 is a diagram illustrating the active region inside the first peripheral area according to some embodiments of the disclosure. As shown in FIG. 9, inside a portion of the first peripheral area A2, an active region 11a comprising six transistors is configured over the monocrystalline silicon substrate 11. It can be appreciated, the active region 11a of any one of the transistors can occupy a certain area of the monocrystalline silicon substrate 11 as shown in FIG. 9, and has a certain depth on the direction of thickness of the monocrystalline silicon substrate 11 as shown in FIG. 5. At least one type of N-type or P-type ion is mixed in the active region 11a depending on the type of the transistors.

It can be appreciated, the above-described step 101a can comprise forming a mask pattern that is arranged over the monocrystalline silicon substrate 11 outside the active region 11a shown in FIG. 9. For example, the mask pattern can be a photoresist layer formed through a photolithographic process, and the multiple opening areas configured in the photoresist layer that expose the area over the monocrystalline silicon substrate that is employed to form the active region 11a. As such, the active region 11a of each of the transistors can be formed in these areas through an ion implantation process in step 101bs, and the above-described mask pattern can be removed through the removal of the photoresist layer in step 101c.

Figure 10:
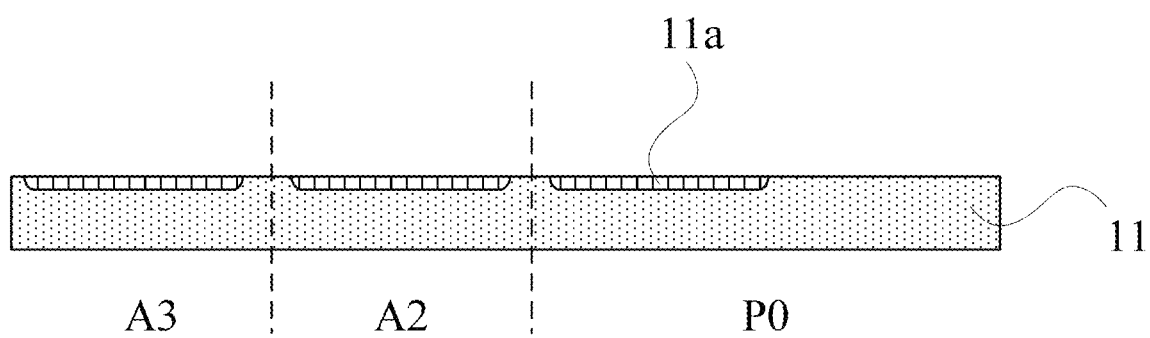
FIG. 10 is a cross-sectional view of the structure of a monocrystalline silicon substrate after fabrication of the active region according to some embodiments of the disclosure.

The structure of the above-described monocrystalline silicon substrate 11 that has been formed through the above-described process is shown in FIG. 10. In FIG. 10, the central display area A1, the first peripheral area A2, and the second peripheral area A3 are already configured over the monocrystalline silicon substrate 11 according to the method as shown in FIG. 1A. The central display area A1 comprises a plurality of pixel regions P0. The formation area of a plurality of transistors is already preset, the active region 11a of each transistor is formed through step 101, and other structures can be manufactured on this basis.

In some embodiment, the above-described step 102 of forming an array circuit layer over the monocrystalline silicon substrate can specifically comprise the following sub-steps (not shown in the figures):

102a: forming a first insulating layer over the monocrystalline silicon substrate;

102b: forming a first metal layer on the first insulating layer, wherein the first metal layer comprises a gate electrode pattern including a plurality of transistors;

102c: forming a second insulating layer over the first metal layer and the first insulating layer, wherein the second insulating layer covers the first metal layer and the first insulating layer;

102d: forming a plurality of first vias in the first insulating layer and the second insulating layer;

102e: forming a second metal layer inside the plurality of first vias and on the second insulating layer, wherein the second metal layer comprises a source electrode pattern and a drain electrode pattern of a plurality of transistors; the source electrode pattern and the drain electrode pattern of the plurality of transistors come into contact with the active regions in the monocrystalline silicon substrate through a plurality of first vias.

Optionally, step 102 can further comprise the following sub-step (not shown in the figures):

102f: forming a planarization layer over the second metal layer and the second insulating layer, wherein the planarization layer covers the second metal layer and the second insulating layer; in each of the pixel regions, a second via is formed in the planarization layer and configured to connect the source electrode or the drain electrode of at least one transistor in the second metal layer to the anode conductive layer.

FIGS. 11-16 are schematic views of the structures of the array circuit layer in the manufacturing process.

Figure 11:
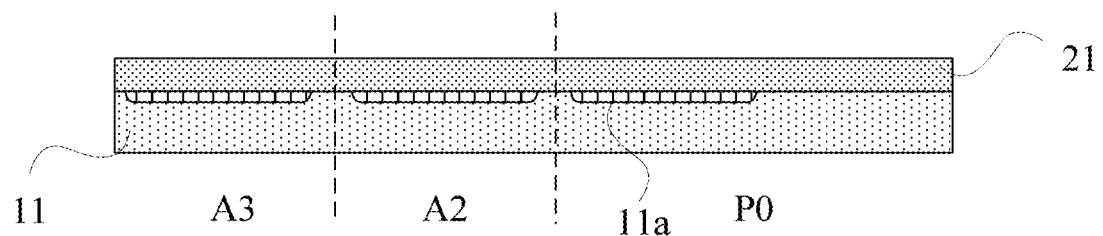
FIG. 11 is a cross-sectional view of an array circuit layer in a first fabrication process.

FIG. 11 shows the structure formed after step 102a. As shown in FIG. 11, a first insulating layer 21 is formed over the structure as shown in FIG. 10 in step 102a. The first insulating layer 21 can comprise a silicon oxide (SiOx) layer, disposed at a bottom, and a silicon nitride (SiNx) layer, disposed at a top, and can be formed through a double deposition process.

Figure 12:
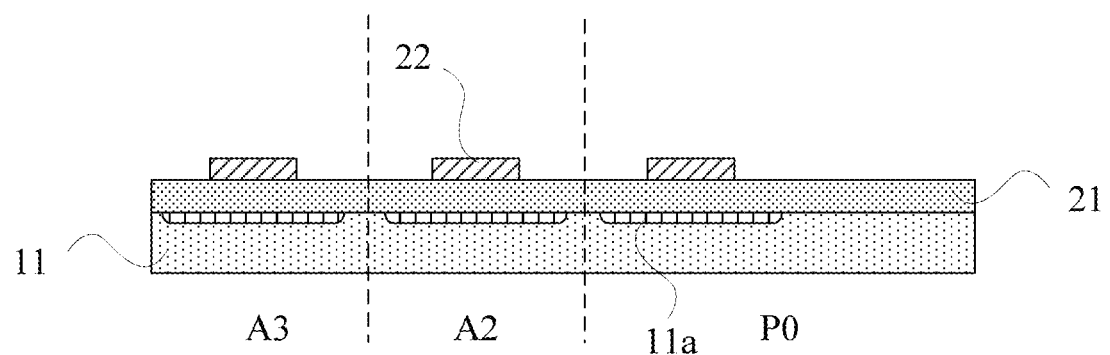
FIG. 12 is a cross-sectional view of an array circuit layer in a second fabrication process.

FIG. 12 shows the structure formed after step 102b. As shown in FIG. 12, the first metal layer 22 comprising the gate electrode pattern is formed over the structure as shown in FIG. 11 in step 102b. It can be appreciated that the formation area of the gate electrode pattern corresponds to the formation area of the active region 11a. Specifically, the first metal layer 22 can be formed through a patterning process: for example, a layer of metal can be deposited first, then this layer of metal is etched employing a photoresist pattern as a mask to form the pattern in the first metal layer 22.

Figure 13:
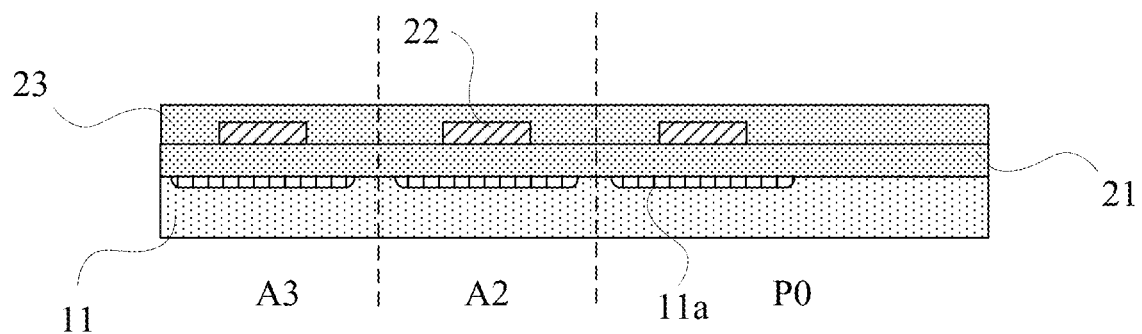
FIG. 13 is a cross-sectional view of an array circuit layer in a third fabrication process.

FIG. 13 shows the structure formed after step 102c. As shown in FIG. 13, a second insulating layer 23 is formed over the structure as shown in FIG. 12 in step 102c. For example, the first insulating layer 23 can comprise a silicon oxide (SiOx) layer, disposed at a bottom, and a silicon nitride (SiNx) layer, disposed at a top, and can be formed through a double deposition process.

Figure 14:
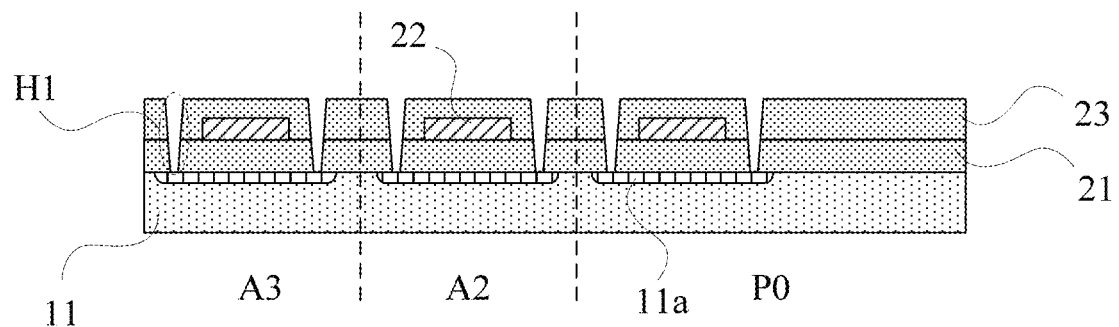
FIG. 14 is a cross-sectional view of an array circuit layer in a fourth fabrication process.

FIG. 14 shows the structure formed after step 102d. As shown in FIG. 14, a plurality of first vias H1 are formed in the first insulating layer 21 and the second insulating layer 23 as shown in FIG. 13. Specifically, it can be formed through methods such as etching. It can be appreciated, that after the formation of the first vias H1, a portion of the active region 11a is exposed such that it can be connected to the source electrodes and the drain electrodes.

Figure 15:
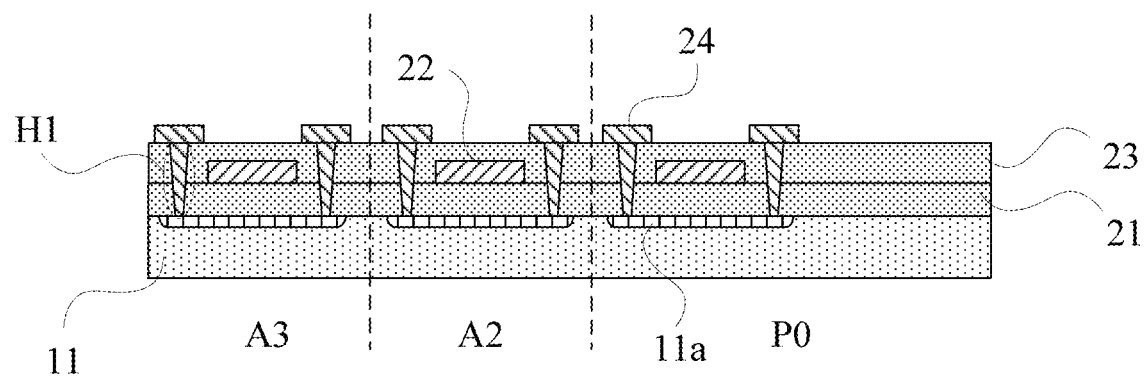
FIG. 15 is a cross-sectional view of an array circuit layer in a fifth fabrication process.

FIG. 15 shows the structure formed after step 102e. As shown in FIG. 12, a second metal layer 24 is formed inside the plurality of vias H1 and over the second insulating layer 23 as shown in FIG. 14, and specifically by a patterning process of the metal deposition. The second metal layer 24 comprises a source electrode pattern and a drain electrode pattern of a plurality of transistors, and the source electrode pattern and the drain electrode pattern come into contact with the active region 11a inside the monocrystalline silicon substrate 11 through a plurality of first vias H1. As such, the fundamental structure of the above-described plurality of transistors is formed.

Figure 16:
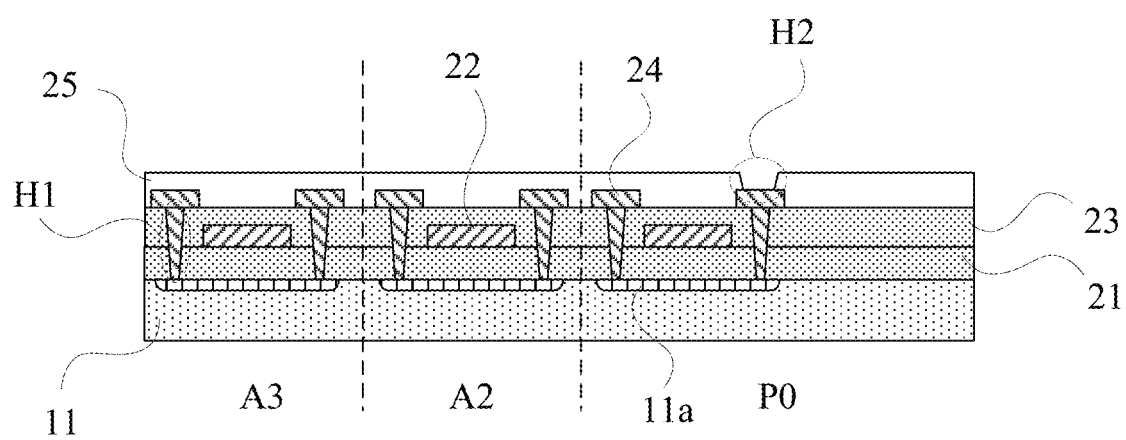
FIG. 16 is a cross-sectional view of an array circuit layer in a sixth fabrication process.

FIG. 16 shows the structure formed after step 102f. As shown in FIG. 16, a planarization layer 25 is formed over the second metal layer 24 and the second insulating layer 23 as shown in FIG. 15 in step 102f, so as to smoothen the surface of the array circuit layer 12. The planarization layer 25 covers the second metal layer 24 and the second insulating layer 23, and therein the second vias H2, employed to connect the source electrode or drain electrode of at least one transistor in the second metal layer 24 to the anode conductive layer 13 in each of the pixel regions P0 can be formed. The planarization layer 25 and the second vias H2 can be formed by existing technologies and it will not be repeated herein.

After formation of the planarization layer 25 in the array circuit layer as shown in FIG. 16, extra steps can be taken to form the various components of the display apparatus as shown in FIG. 7.

In a first extra step, by patterning and deposition, an anode conductive layer 13 can be formed in each of the pixel regions P0, such that the anode conductive layer 13 comes into contact with the source electrode or drain electrode of at least one transistor in the second metal layer 24 through the second vias H2, as illustrated in FIG. 5.

In a second extra step, by patterning and deposition, a pixel defining layer 31 can be formed over the planarization layer 25 such that the pixel defining layer 31 covers the planarization layer 25 whereas the anode conductive layer 13 is exposed (figure not shown).

In a third extra step, by evaporation, an organic light-emitting layer 32 can be formed over the anode conductive layer 13, and further by evaporation, a cathode conductive layer 33 can be formed over the organic light-emitting layer 32 (figure not shown).

In a fourth extra step, by encapsulation, a cover glass is disposed over the first peripheral area, the second peripheral area, and the display area to ultimately form a display panel (figure not shown).

It should be noted that the array substrates or display apparatus having other alternative structures can also be manufactured by the manufacturing method disclosed herein.

Throughout the disclosure, it should be noted that the orientation or the positional relationship as indicated by the terms such as and "top" and "bottom", are orientation or positional relationship based on the drawings, and serve only to facilitate and simplify the present description, and does not indicate or imply that the device or element must have a particular orientation, or it must be constructed or operated with particular orientation, and therefore it cannot be construed as limiting the disclosure. Unless otherwise clearly defined and limited, the term "connected," "connection," and "coupled" should be broadly interpreted, for example, it may be a fixed connection, it can be a removable connection, or an integral connection; it may be a mechanical connection, may be an electrical connection; it may be a direct connection, may be a connection through intermediaries, or an internal connection of two components. Those of ordinary skill in the art can understand the meanings of the aforementioned terms in disclosure according to the specific context.

In the description of the disclosure, numerous specific details are described. However, it can be understood that the embodiments of the disclosure may be implemented without these specific details. In some embodiments, well-known methods, structures and techniques are not described in details, so as not to obscure the comprehension to this description.

Similarly, it should be understood, that in order to simplify the disclosure and help the understanding of one or multiple aspects of the disclosure, in the description of the embodiments of the disclosure, various features of the disclosure are sometimes grouped together in a single embodiment, figure, or description thereof. However, it should not be interpreted as the methods of the disclosure reflecting the following intentions: that is, the disclosure requires more features than the features expressly described in each of the claims. More specifically, as reflected in the claims, inventive aspects are less than all features of a single embodiment disclosed above. Thus, the claims following the requirements of specific embodiments are hereby expressly incorporated into these particular embodiments, each claim itself is regarded as a separate embodiment of the disclosure.

It should be noted that the above embodiments of the disclosure are intended to describe rather than limit the disclosure, and that those skilled in the art can design alternative embodiments without departing from the scope of the claim. In the claims, any reference signs placed between parentheses should not be construed as limitations to the claims. The word "comprise(s)", "include(s)", "comprising" and "including" do not exclude components or steps that are not listed in the claims. The word "a" or "an" does not exclude the existence of a plurality of such components. The disclosure may be implemented by hardware comprising several distinct components and by means of a computer that is suitably programmed. In a single claim that lists several apparatuses, several of these components may be implemented through a single hardware. The use of the word first, second, and third, etc. does not denote any order. These words can be interpreted as names.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate having a substrate, comprising:
  a monocrystalline silicon substrate employed as the substrate comprising a central display area, a first peripheral area, and a second peripheral area;
  substrate circuits integrated with a scan drive circuit in the first peripheral area, a data drive circuit in the second peripheral area, and a plurality of pixel circuits in the central display area;
  a plurality of scan lines in the central display area and coupled to the scan drive circuit; and
  a plurality of data lines in the central display area and coupled to the data drive circuit;
  wherein:
  a plurality of pixel regions are defined by intersections of the plurality of scan lines and the plurality of data lines;
  pixel circuit in each of the pixel regions is coupled to one of the scan lines and one of the data lines;
  the scan drive circuit, the data drive circuit, and the plurality of pixel circuits comprise a plurality of transistors, each of which has an active region inside the monocrystalline silicon substrate; and
  carrier mobility of the monocrystalline silicon substrate is greater than 600 $cm^2$/V-sec,
  wherein the substrate circuits further comprise:
  a first insulating layer, disposed over the monocrystalline silicon substrate;
  a first electrode metal layer, disposed over the first insulating layer and comprising a gate electrode pattern of the plurality of transistors;
  a second insulating layer, disposed over and covering the first electrode metal layer and the first insulating layer;
  a second electrode metal layer, disposed over the second insulating layer and comprising a drain electrode pattern and a source electrode pattern of the plurality of transistors; and
  a plurality of first vias, arranged to run through the first insulating layer and the second insulating layer, and configured to couple the drain electrode pattern or the source electrode pattern of the plurality of transistors to the active region inside the monocrystalline silicon substrate,
  wherein the data lines are disposed in the first electrode metal layer, and the scan lines are disposed in the second electrode metal layer,
  wherein the gate electrode pattern is connected to one of the scan lines though a connection hole in the second insulating layer.

2. The array substrate according to claim 1, wherein the active region is an ion-doped part of the monocrystalline silicon substrate.

3. The array substrate according to claim 1, further comprising an anode conductive layer, wherein the anode conductive layer is arranged in each of the plurality of pixel regions, disposed over the second electrode metal layer of the substrate circuits, and configured to output a drive current of an organic light-emitting layer in each of the plurality of pixel regions.

4. The array substrate according to claim 3, wherein the substrate circuits further comprises a planarization layer, wherein:
  the planarization layer is disposed over and covering the second electrode metal layer and the second insulating layer and below the anode conductive layer; and
  within each of the plurality of pixel regions, the planarization layer is arranged with a second via, configured to couple the source electrode pattern or the drain electrode pattern of the plurality of transistors in the second metal layer to the anode conductive layer.

5. The array substrate according to claim 4, wherein a reflective surface is arranged on a surface of the anode conductive layer opposite to the substrate, and is configured to reflect light emitted from the organic light-emitting layer.

6. The array substrate according to claim 1, wherein the active region is a part of the monocrystalline silicon substrate at a side facing the substrate circuits, and the active region has a thickness less than that of the monocrystalline silicon substrate.

7. The array substrate according to claim 6, wherein the active region has a dopant concentration smaller than that of a part of the monocrystalline silicon substrate other than the active region.

8. A display apparatus, comprising an array substrate according to claim 1.

9. The display apparatus of claim 8, further comprising an organic light-emitting layer, disposed over the array substrate in a region for each of the plurality of pixels and configured to emit light upon application of a drive current.

10. The display apparatus of claim 9, further comprising a transparent cathode conductive layer, disposed over the organic light-emitting layer in the region for each of the plurality of pixels.

11. The display apparatus of claim 10, further comprising a pixel defining layer, disposed over the array substrate, wherein:
the pixel defining layer is provided with an opening for disposing the organic light-emitting layer and the transparent cathode conductive layer in each of the plurality of pixels.

12. A method for manufacturing an array substrate according to claim 1, comprising:
forming an active region for each of the plurality of transistors in the monocrystalline silicon substrate; and
forming a circuit layer including a gate layer and a source/drain layer over the monocrystalline silicon substrate,
wherein forming the circuit layer over the monocrystalline silicon substrate comprises:
forming a first insulating layer over the monocrystalline silicon substrate; forming the gate layer over the first insulating layer, wherein the gate layer comprises a gate electrode pattern of the plurality of transistors and a plurality of data lines;
forming a second insulating layer over the gate layer and the first insulating layer, the second insulating layer covering the gate layer and the first insulating layer;
forming a plurality of first vias, such that the plurality of first vias each runs through the first insulating layer and the second insulating layer; and
forming the source/drain layer in the plurality of first vias and over the second insulating layer, the source/drain layer comprising a source electrode pattern and a drain electrode pattern of the plurality of transistors and a plurality of scan lines, and the source electrode pattern and the drain electrode pattern of the plurality of transistors being coupled to the active region in the monocrystalline silicon substrate via the plurality of first vias,
wherein the gate electrode pattern is connected to one of the scan lines though a connection hole in the second insulating layer.

13. The method of claim 12, wherein forming the active region for each of the plurality of transistors in the monocrystalline silicon substrate comprises:
forming a mask pattern over the monocrystalline silicon substrate, the mask pattern covering areas outside the active region for each of the plurality of transistors; and
performing ion implantation to the monocrystalline silicon substrate under cover of the mask pattern, so as to form the active region for each of the plurality of transistors inside the monocrystalline silicon substrate.

14. The method of claim 12, wherein forming the circuit layer over the monocrystalline silicon substrate further comprises:
forming a planarization layer over the source/drain layer and the second insulating layer, wherein the planarization layer covers the source/drain layer and the second insulating layer.

15. The method of claim 14, further comprising, after forming the circuit layer over the monocrystalline silicon substrate:
forming an anode conductive layer over the circuit layer, wherein forming the circuit layer comprises:
forming a plurality of second vias, wherein each of the plurality of second vias runs through the planarization layer within a region for each of the plurality of pixel regions; and
forming the anode conductive layer in the plurality of second vias and over the planarization layer, and within each of the plurality of pixel regions;
wherein at least one of the first insulating layer and the second insulating layer are formed by a double deposition process, comprising:
forming a silicon oxide (SiOx) layer; and
forming a silicon nitride (SiNx) layer over the silicon oxide (SiOx) layer.

16. The array substrate according to claim 1, wherein the active region is of P-doped region or N-doped region, the source electrode pattern and the drain electrode pattern contact with the active region at different locations so as to form a channel area.

* * * * *